(12) United States Patent
Huang et al.

(10) Patent No.: US 12,278,189 B2
(45) Date of Patent: Apr. 15, 2025

(54) ELECTRONIC PACKAGE AND MANUFACTURING METHOD THEREOF

(71) Applicant: SILICONWARE PRECISION INDUSTRIES CO., LTD., Taichung (TW)

(72) Inventors: Yu-Lung Huang, Taichung (TW); Chih-Ming Huang, Taichung (TW); Kuo-Hua Yu, Taichung (TW); Chang-Fu Lin, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 0 days.

(21) Appl. No.: 18/376,652

(22) Filed: Oct. 4, 2023

(65) Prior Publication Data
US 2024/0038670 A1 Feb. 1, 2024

Related U.S. Application Data

(60) Continuation of application No. 17/978,493, filed on Nov. 1, 2022, now Pat. No. 11,810,862, which is a (Continued)

(30) Foreign Application Priority Data

Aug. 27, 2020 (TW) .................................. 109129354

(51) Int. Cl.
*H01L 23/538* (2006.01)
*H01L 21/48* (2006.01)
*H01L 23/498* (2006.01)

(52) U.S. Cl.
CPC ........ *H01L 23/5381* (2013.01); *H01L 21/481* (2013.01); *H01L 21/4857* (2013.01); *H01L 23/49822* (2013.01); *H01L 23/49833* (2013.01); *H01L 23/5385* (2013.01); *H01L 21/4853* (2013.01)

(58) Field of Classification Search
CPC .......... H01L 21/4857; H01L 23/49822; H01L 23/49833; H01L 23/5381; H01L 23/5385; H01L 23/538
See application file for complete search history.

(56) References Cited

U.S. PATENT DOCUMENTS

2018/0102311 A1 4/2018 Shih
2019/0287904 A1 9/2019 Seidemann et al.
(Continued)

*Primary Examiner* — Evan G Clinton
(74) *Attorney, Agent, or Firm* — Dority & Manning, P.A.

(57) ABSTRACT

An electronic package is provided, in which a circuit board and a circuit block are embedded in an encapsulating layer at a distance to each other, and circuit structures are formed on the two opposite surfaces of the encapsulating layer with electronic components arranged on one of the circuit structures. The circuit block and the circuit board embedded in the encapsulating layer are spaced apart from each other to allow to separate current conduction paths. As such, the circuit board will not overheat, and issues associated with warpage of the circuit board can be eliminated. Moreover, by embedding the circuit block and the circuit board in the encapsulating layer at a distance to each other, the structural strength of the encapsulating layer can be improved.

15 Claims, 8 Drawing Sheets

Related U.S. Application Data division of application No. 17/068,988, filed on Oct. 13, 2020, now Pat. No. 11,521,930.

(56) References Cited

U.S. PATENT DOCUMENTS

| | | |
|---|---|---|
| 2021/0159211 A1 | 5/2021 | Rubin et al. |
| 2021/0193562 A1* | 6/2021 | Lee .................... H01L 23/5384 |
| 2022/0045008 A1* | 2/2022 | Kang ................... H01L 23/5385 |

* cited by examiner

ELECTRONIC PACKAGE AND MANUFACTURING METHOD THEREOF

This application is a Continuation of U.S. Ser. No. 17/978,493, filed Nov. 1, 2022, which is a divisional of U.S. Ser. No. 17/088,988, filed Oct. 19, 2020 (now U.S. Pat. No. 11,521,930) The present disclosure relates to a semiconductor device, and more particularly, to an electronic package having a composite substrate and a manufacturing method of the electronic package.

BACKGROUND

1. Technical Field

The present disclosure relates to a semiconductor device, and more particularly, to an electronic package having a composite substrate and a manufacturing method of the electronic package.

2. Description of Related Art

With the rapid development in electronic industry, electronic products are trending towards multiple functions and high performance. Currently, there are numerous techniques used in the field of chip packaging, including, for example, flip-chip packaging modules, such as Chip Scale Package (CSP), Direct Chip Attached (DCA) or Multi-Chip Module (MCM), or chip stacking techniques involving stacking chips one on top of another to be integrated into a three-dimensional (3D) integrated circuit (IC).

FIG. 1 is a schematic cross-sectional view of a conventional semiconductor package 1. First, a through silicon interposer (TSI) 10 having a transfer side 10a and a chip placement side 10b opposite to each other. The TSI 10 has a plurality of through-silicon vias (TSVs) 100 interconnecting the chip placement side 10b and the transfer side 10a, and a circuit structure 11 (e.g., a redistribution layer [RDL]) is formed on the chip placement side 10b for attachment with a semiconductor chip 15 having solder bumps 150 with a smaller pitch. The TSI 10 is then disposed on a package substrate 13 with a larger line pitch via a plurality of conductive components 18 on the transfer side 10a, and the package substrate 13 is electrically connected with the TSVs 100. Thereafter, an encapsulant 16 is formed on the package substrate 13 to encapsulate the semiconductor chip 15 and the TSI 10. Finally, a plurality of solder balls 12 are formed on the solder ball pads 130 at the lower side of the package substrate 13 to be attached onto a circuit board 1'.

In the conventional semiconductor package 1, power/signal transmission between the semiconductor chip 15 and the package substrate 13 are conducted through the circuit structure 11.

However, driven by the demands for more functions in products, the functional requirements of the semiconductor chip 15 have also increased. As a result, the contacts (e.g., the solder bumps 150) of the semiconductor chip 15 and the line density of the circuit structure 11 have increased. In these circumstances, the RDL-type circuit structure 11 is too small and its structural strength is weak, which may result in warpage under high temperature, and in turn, the lines of the circuit structure 11 to be broken.

On the other hand, if broken lines of the circuit structure 11 are to be avoided, then the widths of the lines of the circuit structure 11 have to be increased, so that its structural strength can be strengthened by the metal materials of the lines. However, this would mean that the circuit structure 11 cannot satisfy the demands for fine lines and it would be difficult to increase the line density of the circuit structure 11, which makes the circuit structure 11 ill-suited for the demands for high-density (or multifunctional) contacts of the semiconductor chip 15.

Therefore, there is a need for a solution that addresses the aforementioned issues in the prior art.

SUMMARY

In view of the aforementioned shortcomings of the prior art, the present disclosure provides an electronic package, which may include: an encapsulating layer having a first surface and a second surface opposite to each other; a circuit board embedded in the encapsulating layer; a circuit block embedded in the encapsulating layer, with a first circuit structure formed on the first surface of the encapsulating layer and electrically connected with the circuit board and the circuit block; an electronic component disposed on the first circuit structure and electrically connected with the first circuit structure; and a second circuit structure formed on the second surface of the encapsulating layer and electrically connected with the circuit board and the circuit block.

The present disclosure further provides a method for manufacturing an electronic package, which may include: providing a circuit board and at least one circuit block at a distance from one another on a carrier board; forming an encapsulating layer on the carrier board for encapsulating the circuit board and the circuit block, wherein the encapsulating layer has a first surface and a second surface opposite to each other, and the encapsulating layer is bonded onto the carrier board via the second surface; forming a first circuit structure on the first surface of the encapsulating layer, the first circuit structure being electrically connected with the circuit board and the circuit block; disposing an electronic component on the first circuit structure, the electronic component being electrically connected with the first circuit structure; removing the carrier board; and forming a second circuit structure on the second surface of the encapsulating layer, the second circuit structure being electrically connected with the circuit board and the circuit block.

In the above electronic package and the manufacturing method thereof, a plurality of circuit blocks are embedded in the encapsulating layer at a distance to one another.

In the above electronic package and the manufacturing method thereof, the circuit board and the circuit block are spaced apart from each other.

In the above electronic package and the manufacturing method thereof, the circuit board is provided with a receiving space for receiving the circuit block, and the encapsulating layer is further formed in the receiving space to encapsulate the circuit block.

In the above electronic package and the manufacturing method thereof, the circuit board is formed with a plurality of grooves. For example, the plurality of grooves form a cross-shaped groove structure. Moreover, the encapsulating layer is formed in the grooves.

In the above electronic package and the manufacturing method thereof, a plurality of conductive structures are embedded in the encapsulating layer.

The above electronic package and the manufacturing method thereof may include encapsulating the electronic component with a packaging layer.

The above electronic package and the manufacturing method thereof may include forming a plurality of conductive components on the second circuit structure.

In the above electronic package and the manufacturing method thereof, the circuit block has at least an insulating body or at least one semiconductor base and at least one conductive pillar embedded in the insulating body or the semiconductor base. For example, a circuit portion electrically connected with the conductive pillar is formed on at least one of the two opposite sides of the insulating body or the semiconductor base.

In the above electronic package and the manufacturing method thereof, the insulating body is an encapsulant, and the semiconductor base includes silicon.

In the above electronic package and the manufacturing method thereof, the circuit board is a coreless circuit structure.

In the above electronic package and the manufacturing method thereof, a plurality of electronic components are provided on the first circuit structure, and a gap is formed between at least two of the plurality of electronic components, such that the circuit block is positioned in the gap for electrically bridging the two electronic components.

In summary, in the above electronic package and the manufacturing method thereof, the circuit block and the circuit board are embedded in the encapsulating layer at a distance to each other to allow to separate current conduction paths. Therefore, compared to the prior art, the circuit board of the present disclosure will not overheat, and issues associated with warpage of the circuit board, such as breaking of the circuit layer of the circuit board, can be eliminated. Moreover, by embedding the circuit block and the circuit board in the encapsulating layer at a distance to each other, the structural strength of the encapsulating layer can be improved.

BRIEF DESCRIPTION OF THE DRAWINGS

FIGS. 2A-1 and 2B to 2H are schematic cross-sectional views of a method for manufacturing an electronic package in accordance with the present disclosure.

FIGS. 2A-2, 2A-3, 2A-4, 2A-5, 2A-6 and 2A-7 are schematic cross-sectional views of a circuit block in FIG. 2A-1 in various aspects.

FIG. 3 is a schematic cross-sectional view of a process subsequent to FIG. 2H.

DETAILED DESCRIPTION

The ways in which the present disclosure can be implemented are illustrated in the following embodiments. One of ordinary skill in the art can readily appreciate other advantages and technical effects of the present disclosure based on the disclosed contents herein.

It should be noted that the structures, ratios, sizes shown in the appended drawings are to be construed in conjunction with the disclosures herein in order to facilitate understanding of those skilled in the art. They are not meant, in any way, to limit the implementations of the present disclosure, and therefore contain no substantial technical meaning. Without influencing the effects created and the objectives achieved by the present disclosure, any modifications, changes or adjustments to the structures, ratios or sizes should fall within the scope encompassed by the technical contents disclosed herein. Meanwhile, terms such as "above," "first," "second," "a," "an," and the like, are for illustrative purposes, and are not meant to limit the scope in which the present disclosure can be implemented. Any variations or modifications made to their relative relationships, without changing the substantial technical contents, are also to be construed as within the scope of the present disclosure.

Figure 1:
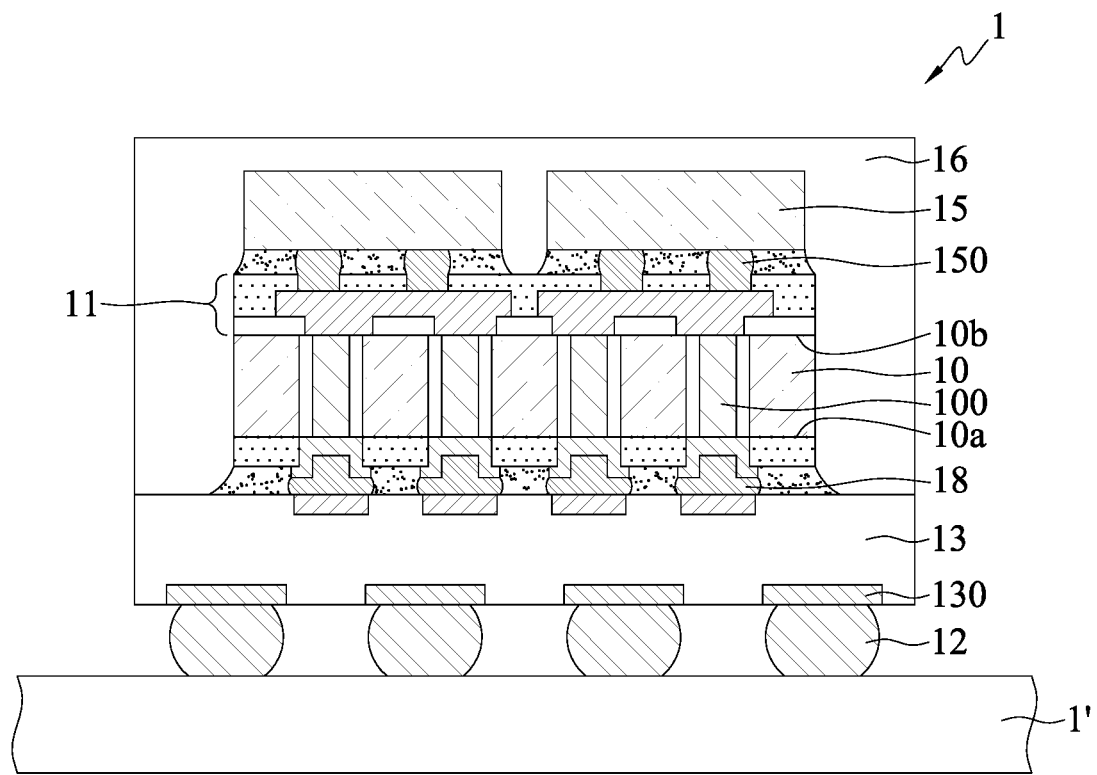
FIG. 1 is a schematic cross-sectional view of a conventional semiconductor package.
Figures 1, 2A:
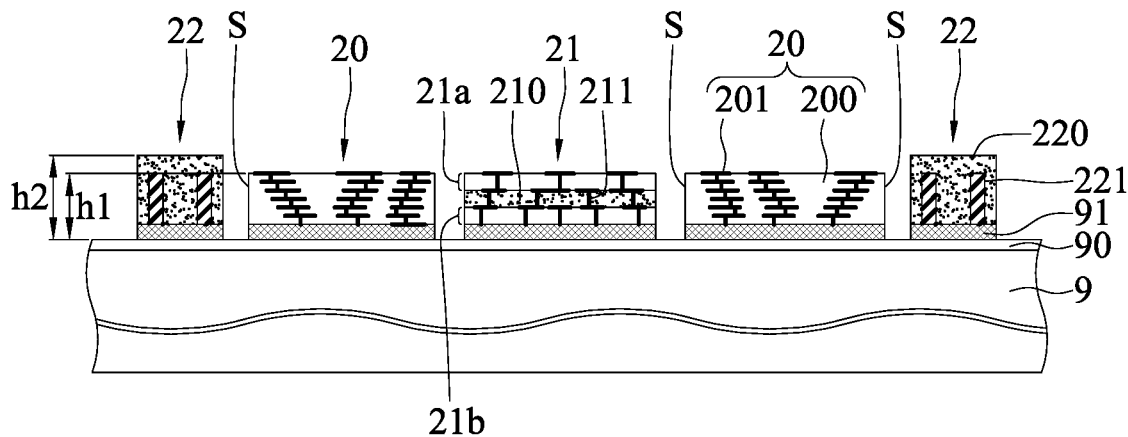
Figures 2, 2A:
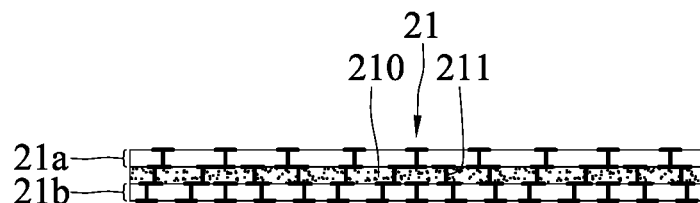
Figures 2, 2A, 3:
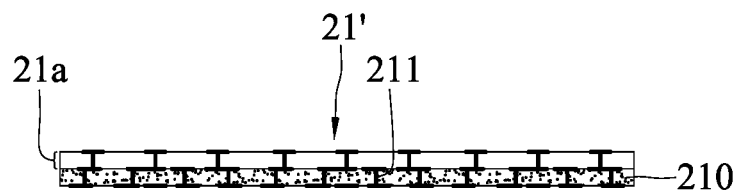
Figures 2, 2A, 3, 4:
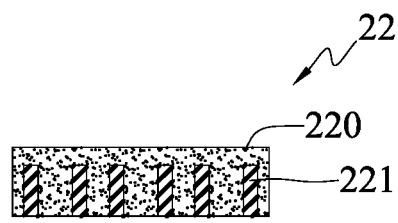
Figures 2, 2A, 3, 4, 5:
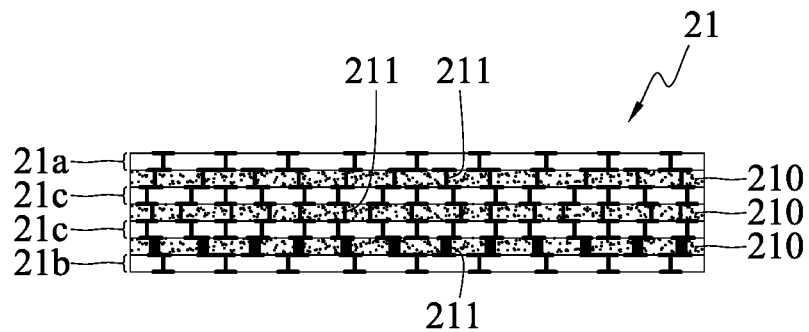
Figures 2, 2A, 3, 4, 5, 6:
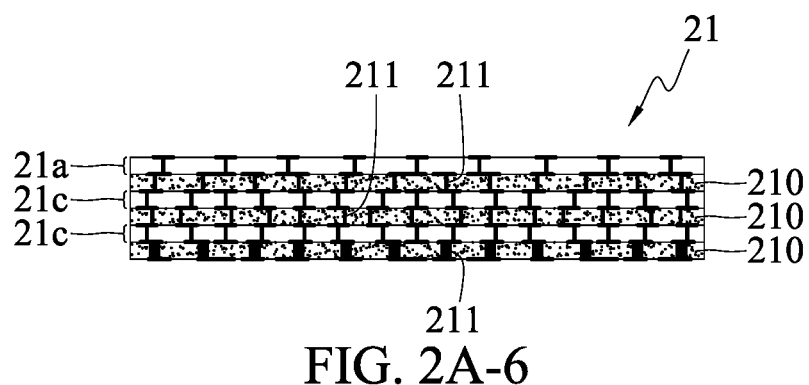
Figures 2, 2A, 3, 4, 5, 6, 7:
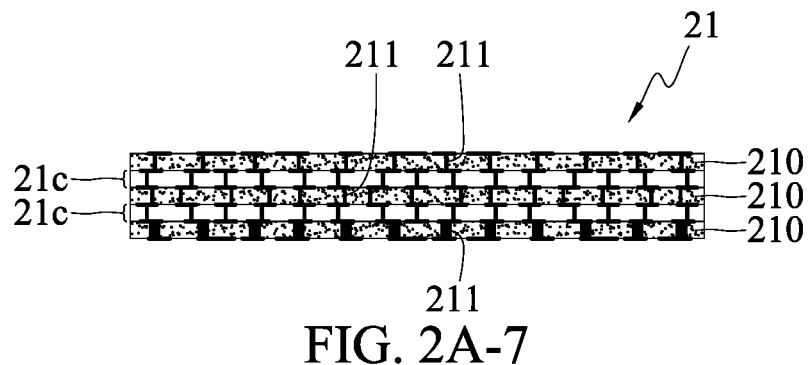
Figure 2B:
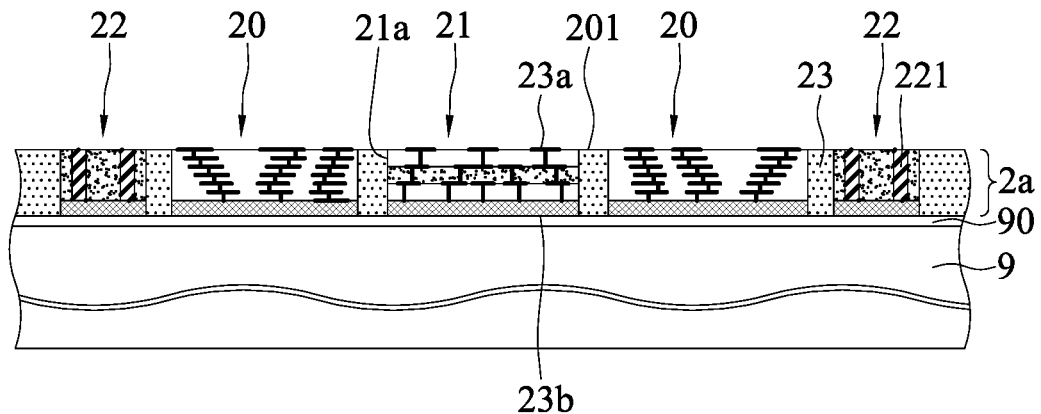
Figure 2C:
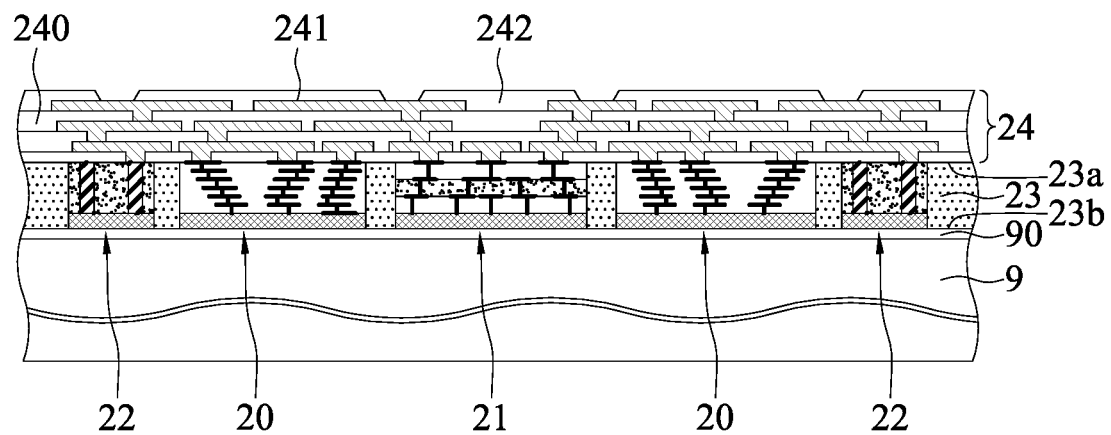
Figure 2D:
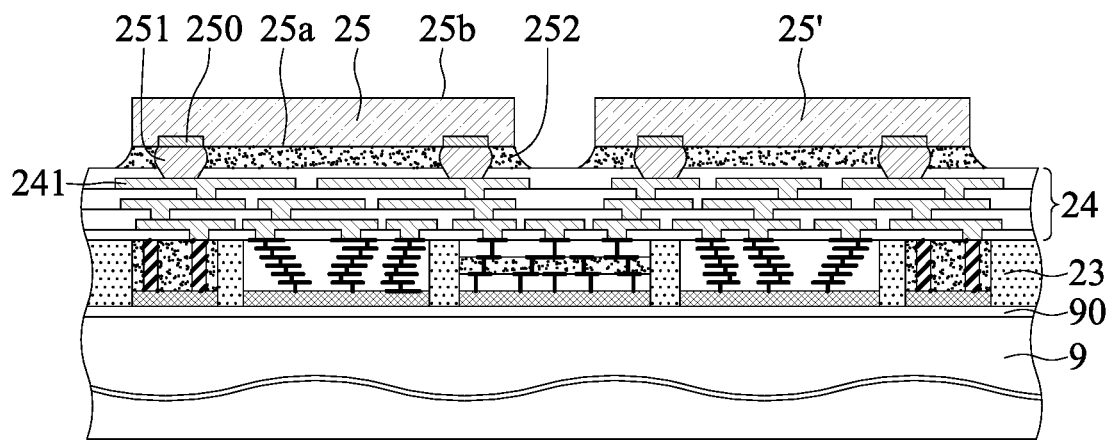
Figure 2E:
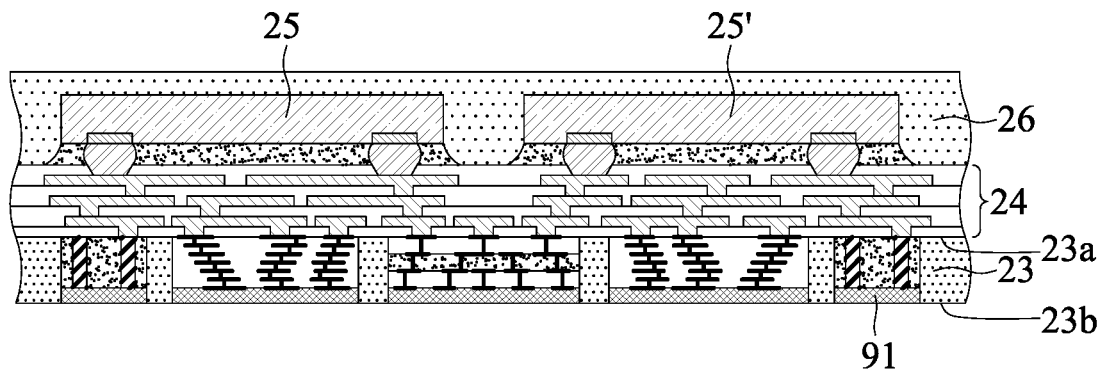
Figure 2F:
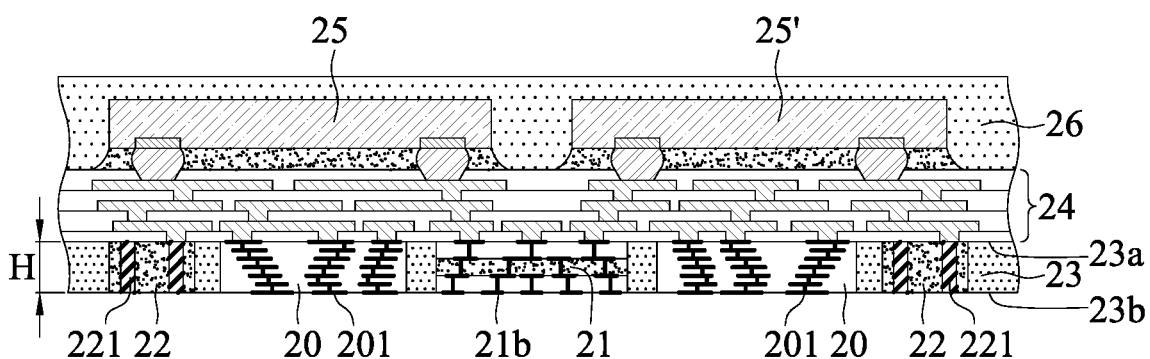
Figure 2G:
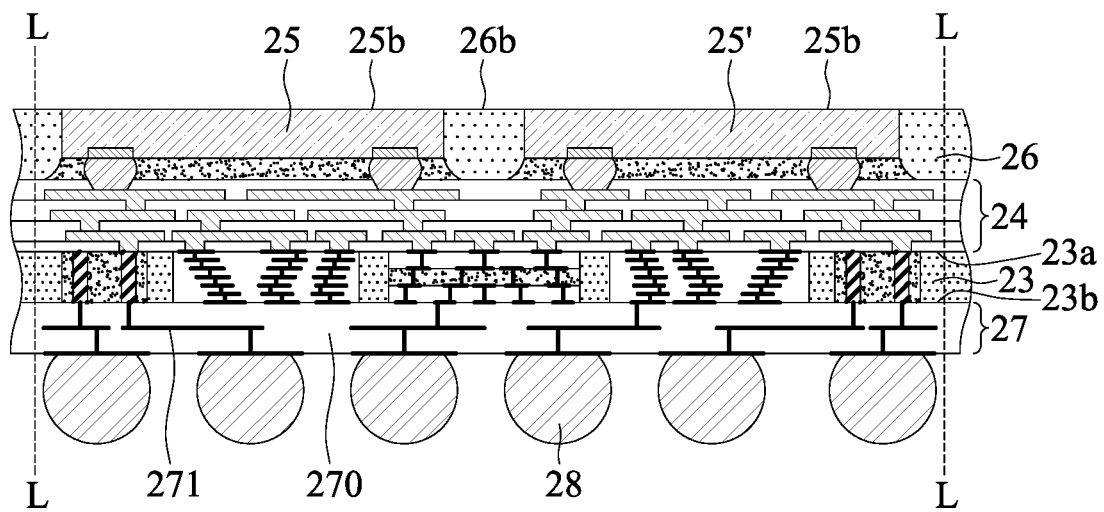
Figure 2H:
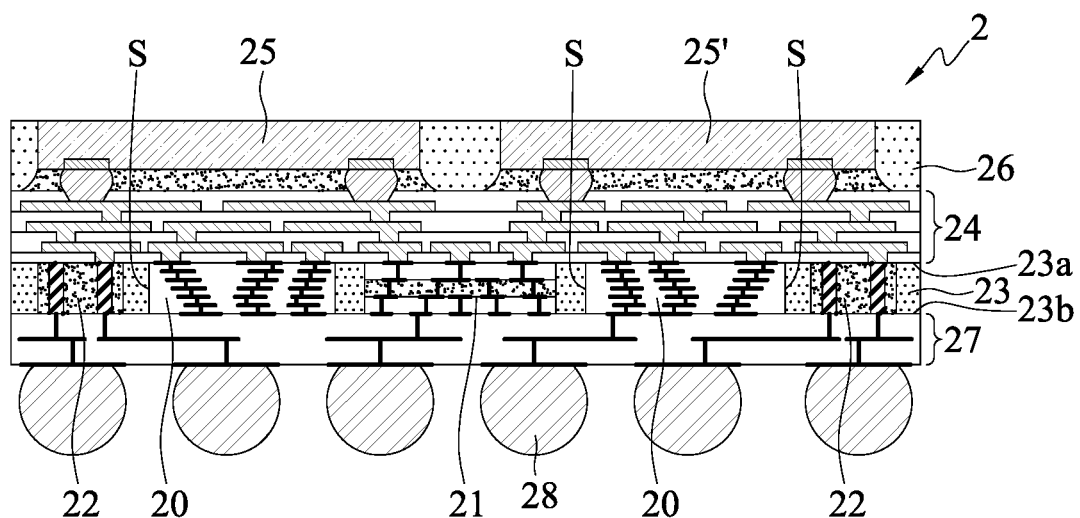
Figure 3:
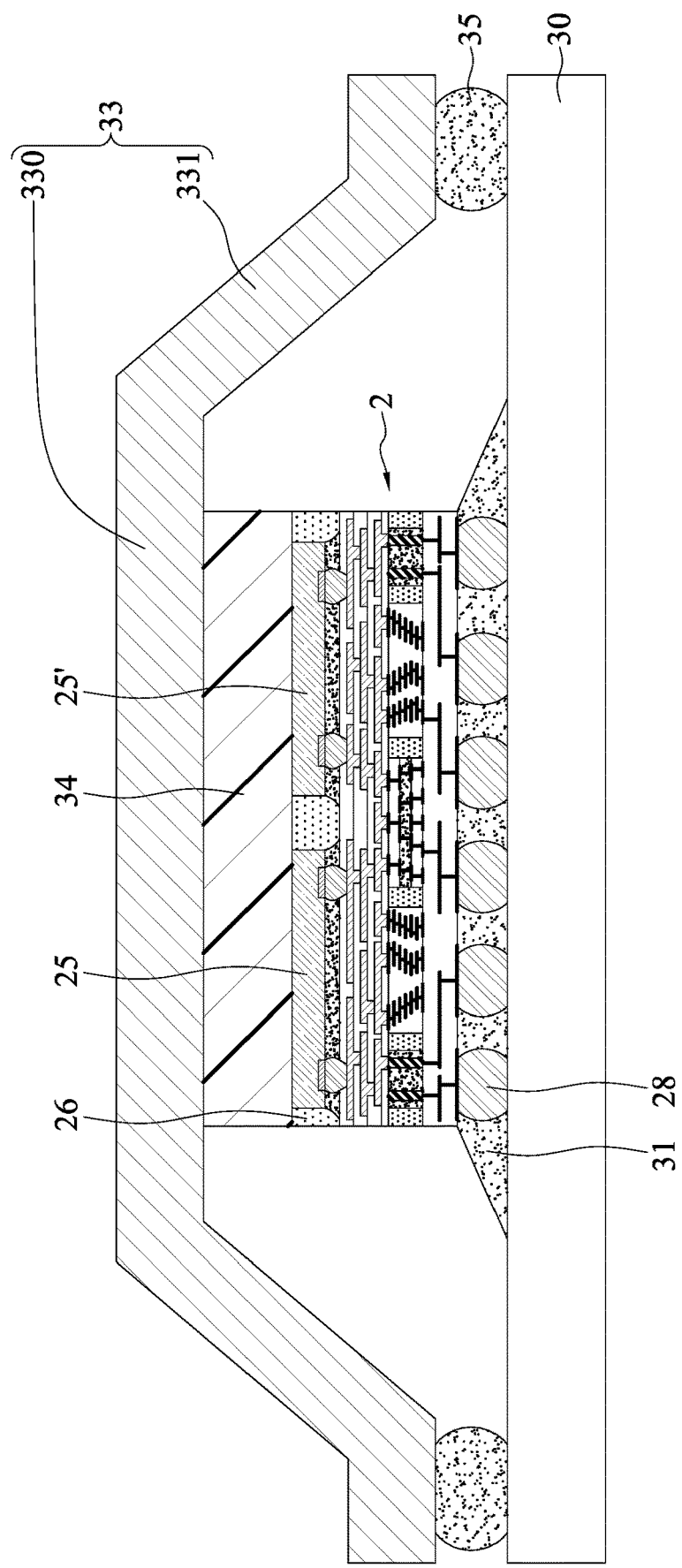

FIGS. 2A-1 to 2H are schematic cross-sectional views of a method for manufacturing an electronic package 2 in accordance with the present disclosure.

As shown in FIG. 2A-1, a circuit board 20 having at least a receiving space S is provided on a carrier board 9. At least a first circuit block 21 and at least a second circuit block 22 are disposed in the receiving space S, such that the circuit board 20, the first circuit block 21 and the second circuit block 22 are spaced apart and not touching each other.

In an embodiment, the circuit board 20 is a coreless circuit structure, which includes at least an insulating layer 200 and a circuit layer 201 provided on the insulating layer 200. For instance, a fan-out type redistribution layer (RDL) circuit layer 201 can be formed from copper, and the insulating layer 200 can be formed from a dielectric material, such as polybenzoxazole (PBO), polyimide (PI), and a prepreg (PP), or a solder-resist material, such as graphite.

Moreover, the first circuit block 21 is in the form of a substrate, which includes an insulating body 210 and at least one conductive pillar 211 embedded in the insulating body 210. For instance, the width (diameter) of the conductive pillars 211 is at most 50 micrometer (μm). More specifically, if needed, a circuit portion 21a can be formed on at least one of the two opposing sides electrically connected to the conductive pillars 211 (such as a single-sided circuit portion 21a shown in FIG. 2A-3 or double-sided circuit portions 21a, 21b shown in FIG. 2A-2), which can be in the form fan-out type RDL, and the insulating body 210 can be formed from PI, a dry film, a molding compound such as an epoxy resin by lamination, molding, and the like, but the present disclosure is not limited to the above. It can be appreciated that, instead of the insulating body 210, the first circuit block 21 may also adopt a semiconductor base containing an appropriate base material such as silicon (Si), glass, other suitable material.

Also, the second circuit block 22 is in the form of a substrate. Similar to the first circuit block 21, the second circuit block 22 includes an insulating body 220 and at least one conductive pillar 221 embedded in the insulating body 220, but without any circuit portions 21a, 21b as shown in FIG. 2A-4. For instance, the conductive pillars 221 can be exposed from only one side of the insulating body 220 to be bonded to the carrier board 9. The height h2 of the second circuit block 22 is greater than the height h1 of the circuit board 20 and the height h1 of the first circuit block 21 (that is, h2>h1). The height h1 of the circuit board 20 is substantially the same as the height h1 of the first circuit block 21. It can be appreciated that the circuit blocks can take the forms of the first circuit block 21 shown in FIG. 2A-2, the second circuit block 22 shown in FIG. 2A-4, or the circuit block 21' shown in FIG. 2A-3 depending on the needs, and there is no particular limitations.

In another embodiment, the first circuit block 21 can be composed of a plurality of insulating bodies (or semiconductor bases) 210 with the conductive pillar(s) 211 and a plurality of circuit portions 21c (e.g., fan-out type RDL) stacked together. The conductive pillar(s) 211 in each of the insulating bodies 210 (or semiconductor bases) is/are electrically connected to the plurality of circuit portions 21c, wherein the widths (diameters) of the conductive pillars 211 in each of the insulating bodies 210 (or semiconductor bases) can be the same or different, such as those shown in FIGS. 2A-5 to 2A-7, the width (diameter) of the conductive pillars 211 in an upper insulating body 210 (or semiconductor base) can be the same as or different from the width (diameter) of the conductive pillars 211 in a lower insulating body 210 (or semiconductor base). For example, the width (diameter) of the conductive pillars 211 in the lowermost insulating body 210 (or semiconductor base) is larger. In addition, circuit portion(s) 21a, 21b can be formed on at least one of the two opposite sides of the first circuit block 21 depending on the needs for electrically connecting with the conductive pillars 211 in the insulating bodies 210 (or semiconductor bases) (such as double-sided circuit portions 21a, 21b shown in FIG. 2A-5 or a single-sided circuit portion 21a shown in FIG. 2A-6). It can be appreciated that the two outer sides of the first circuit block 21 can be insulating bodies 210 (or semiconductor bases) without any circuit portions 21a, 21b, 21c, such as that shown in FIG. 2A-7.

In addition, the carrier board 9 can be a board made of a semiconductor material (e.g., silicon or glass) having a release layer 90 formed thereon. The circuit board 20 and the circuit blocks (e.g., the first circuit block 21, the second circuit block 22, or the circuit block 21' shown in FIG. 2A-3) can be disposed on the release layer 90 via a bonding layer 91 (e.g., an adhesive).

As shown in FIG. 2B, an encapsulating layer 23 is formed on the carrier board 9 (the release layer 90), such that the encapsulating layer 23 encapsulates the circuit board 20, the first circuit block 21 and the second circuit block 22. The encapsulating layer 23, the circuit board 20, the first circuit block 21 and the second circuit block 22 thus form a composite substrate 2a, and the top surfaces of the second circuit block 22, the first circuit block 21 and the circuit board 20 are all exposed from the encapsulating layer 23.

In an embodiment, the encapsulating layer 23 is an insulating material, such as PI, a dry film, and a molding compound such as an epoxy resin. For example, the encapsulating layer 23 can be formed on the carrier board 9 (the release layer 90) by liquid compound application, injection, lamination or compression molding.

Furthermore, the encapsulating layer 23 includes a first surface 23a and a second surface 23b opposite to each other. The encapsulating layer 23 is bonded onto the carrier board 9 (the release layer 90) via the second surface 23b. A planarization process is conducted to allow the conductive pillars 221 of the second circuit block 22, the circuit portion 21a of the first circuit block 21, and the circuit layer 201 of the circuit board 20 to be exposed from the first surface 23a of the encapsulating layer 23. For instance, a portion of the second circuit block 22 and a portion of the encapsulating layer 23 are removed by polishing, such that the top surfaces of the second circuit block 22, the first circuit block 21 and the circuit board 20 are flush with the first surface 23a of the encapsulating layer 23.

Therefore, in the composite substrate 2a, the first and second circuit blocks 21 and 22 and the circuit board 20 are embedded in the encapsulating layer 23 at a distance to each other. This improves the structural strength of the encapsulating layer 23.

As shown in FIG. 2C, a first circuit structure 24 is formed on the first surface 23a of the encapsulating layer 23, the circuit board 20, the first circuit block 21 and the second circuit block 22. The first circuit structure 24 is electrically connected with the circuit board 20, the first circuit block 21 and the second circuit block 22.

In an embodiment, the first circuit structure 24 includes at least a first RDL 241 electrically connected with the conductive pillars 221, the circuit layer 201 and the circuit portion 21a. For example, the first RDL 241 can be formed from copper.

Moreover, the first circuit structure 24 can further include at least a first insulating layer 240 on which the first RDL 241 can be routed. The first insulating layer 240 can be formed from a dielectric material, such as PBO, PI, a prepreg, etc. It can be appreciated that the first insulating layer 240 can include multiple layers of the first RDLs 241. Furthermore, an insulating protective layer 242 (e.g., a solder resist layer) can further be formed on the outermost first insulating layer 240 of the first circuit structure 24 with the outermost first RDL 241 partially exposed from the insulating protective layer 242.

As shown in FIG. 2D, at least an electronic component 25, 25' is attached on the first circuit structure 24.

In an embodiment, a plurality of electronic components 25, 25' are arranged on the first circuit structure 24. The electronic component 25, 25' can be an active component, a passive component or a combination of both, wherein the active component can be, for example, a semiconductor chip, and the passive component can be, for example, a resistor, a capacitor, or an inductor. For instance, the electronic component 25, 25' is a semiconductor chip with an active face 25a and a non-active face 25b opposing the active face 25a. The electronic component 25, 25' is disposed on the first RDL 241 and electrically connected with the first RDL 241 through electrode pads 250 on the active face 25a and a plurality of conductive bumps 251 (e.g., a soldering material) by flip-chip bonding. The conductive bumps 251 are encapsulated by an underfill 252. Alternatively, the electronic component 25, 25' is disposed on the first circuit structure 24 with the non-active face 25b facing the first circuit structure 24, and is electrically connected with the first RDL 241 via a plurality of wires (not shown) by wire bonding, or is electrically connected with the first RDL 241 via a conductive material, such as conductive adhesive or solder paste (not shown). However, the ways in which electronic components 25, 25' are electrically connected to the first RDL 241 are not limited to those described above.

Furthermore, there is a gap between at least two of the plurality of electronic components 25, 25', such that the first circuit block 21 is positioned in the gap for electrically bridging the adjacent two electronic components 25, 25'.

Also, an under bump metallurgy (UBM) (not shown) can be formed on the outermost first RDL 241 to facilitate bonding with the conductive bumps 251.

As shown in FIG. 2E, a packaging layer 26 is formed on the first circuit structure 24 for encapsulating the electronic components 25, 25' and the underfill 252. Then, the carrier board 9 and the release layer 90 are removed to expose the bonding layer 91 and the second surface 23b of the encapsulating layer 23.

In an embodiment, the packaging layer 26 is an insulating material, such as PI, a dry film, or a molding compound such as an epoxy resin, and formed on the first circuit structure 24 by lamination, molding and the like. It can be appreciated that the material forming the packaging layer 26 can be the same as or different from the material forming the encapsulating layer 23.

Moreover, if underfill 252 is not present, the packaging layer 26 can encapsulate the conductive bumps 251.

As shown in FIG. 2F, a planarization process, such as polishing, is performed to remove a portion of the second surface 23b of the encapsulating layer 23, as well as the bonding layer 91.

In an embodiment, the bottom surfaces of the second circuit block 22, the first circuit block 21 and the circuit board 20 are flush with the second surface 23b of the encapsulating layer 23, that is, the second circuit block 22, the first circuit block 21, the circuit board 20 and the encapsulating layer 23 all have the same heights H, such that the conductive pillars 221 of the second circuit block 22, the wiring portion 21b of the first circuit block 21 and the circuit layer 201 of the circuit board 20 are all exposed from the second surface 23b of the encapsulating layer 23.

As shown in FIG. 2G, a RDL process is performed to form a second circuit structure 27 on the second surface 23b of the encapsulating layer 23, and the second circuit structure 27 is electrically connected with the conductive pillars 221 of the second circuit block 22, the wiring portion 21b of the first circuit block 21 and the circuit layer 201 of the circuit board 20.

In an embodiment, the second circuit structure 27 includes at least a second insulating layer 270 and a second RDL 271 formed on the second insulating layer 270, and the outermost second insulating layer 270 can be used as a solder resist layer, and the outermost second RDL 271 is exposed from the solder resist layer.

Furthermore, the second RDL 271 can be formed from copper, and the second insulating layer 270 can be formed from a dielectric material, such as PBO, PI, a prepreg, etc.

Also, a plurality of conductive components 28 electrically connected with the second RDL 271 are formed on the second circuit structure 27. These conductive components 28 are bonded on a support (not shown). For instance, the support may be, for example, a semiconductor, dielectric, ceramic, glass, or metal board, but the present disclosure is not limited to these. Depending on the needs, the support can be a wafer-form substrate or a standard panel-form substrate with an insulating temporary layer (not shown) thereon, such as a release film or glue, so as to embed the conductive components 28 in the insulating temporary layer (not shown).

In addition, a planarization process can be performed, such that the non-active faces 25b of the electronic components 25, 25' are flush with a surface 26a of the packaging layer 26. For instance, portions of the electronic components 25, 25' and a portion of the packaging layer 26 are removed by polishing.

As shown in FIG. 2H, the support and the insulating temporary layer on the support are removed to expose the second circuit structure 27 and the conductive components 28. Then, a singulation process is performed along cutting paths L as shown in FIG. 2G to obtain an electronic package 2.

In a subsequent process, as shown in FIG. 3, the electronic package 2 can be disposed on a package substrate 30 using the conductive components 28, and the conductive components 28 are encapsulated by an underfill 31. A top piece 330 of a heat sink 33 is then bonded onto the non-active faces 25b of the electronic components 25, 25' and the packaging layer 26 of the electronic package 2 via a thermal paste 34. Supporting legs 331 of the heat sink 33 stand on the package substrate 30 via an adhesive layer 35. A plurality of solder balls (not shown) are then formed on the underside of the package substrate 30.

In an embodiment, the first circuit block 21 is used as a relay portion for transmitting signals between the electronic components 25, 25' and the package substrate 30, and the second circuit blocks 22 are used as relay portions for transmitting power between the electronic components 25, 25' and the package substrate 30. For instance, with the design of the circuit portion 21a, 21b of the first circuit block 21, signals can be separately transmitted to two electronic components 25, 25' (that is, the first circuit block 21 acting as a bridging component between the two electronic components 25, 25').

Therefore, with the design of the composite substrate 2a produced using the manufacturing method of the present disclosure, the first circuit block 21, the second circuit blocks 22 and the circuit board 20 are embedded in the encapsulating layer 23 at a distance from one another, so that the first circuit block 21 can be used as a signal transmission path, whereas the second circuit block 22 can be used as power transmission paths. Thus, compared to the prior art, overheating will not occur in the circuit layer 201 of the circuit board 20 of the present disclosure. This avoids warpage of the circuit board 20, and in turn, prevents the circuit layer 201 of the circuit board 20 from breaking. In other words, when the functional requirements of the electronic components 25, 25' increase, the numbers of the first circuit block 21 and the second circuit block 22 can be increased as needed, allowing the circuit layer 201 of the circuit board 20 to have fine lines.

Figure 4A:
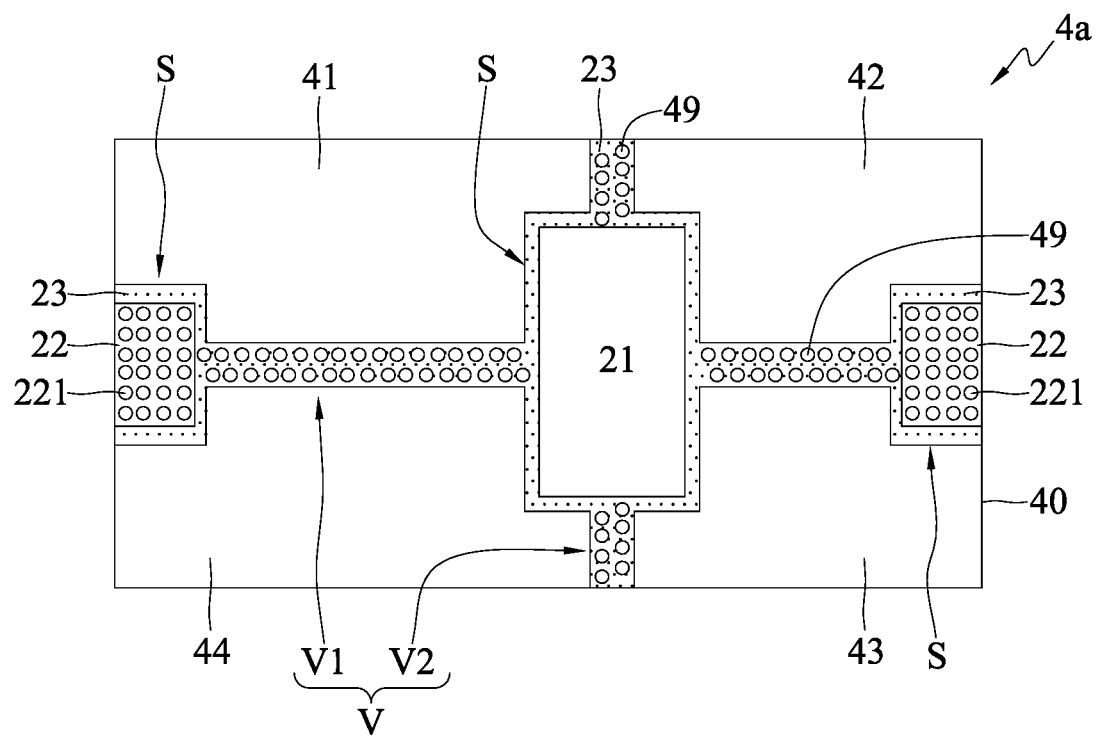
FIG. 4A is a schematic top view of a composite substrate of an electronic package in accordance with another embodiment of the present disclosure.
Figure 4B:
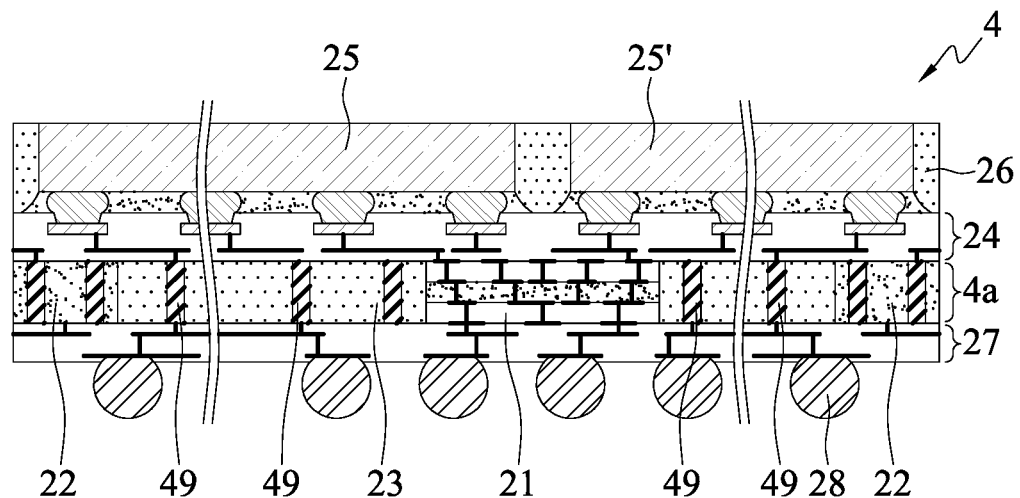
FIG. 4B is a schematic cross-sectional view of the electronic package in accordance with the another embodiment of the present disclosure.

In addition, a composite substrate 4a (as shown in FIGS. 4A and 4B) including a plurality of conductive structures 49 arranged in the encapsulating layer 23 of the electronic package 2 can be formed depending on the needs. For instance, the conductive structures 49 can be metal pillars, such as copper pillars. Therefore, when the functional requirements of the electronic components 25, 25' increase, the number of the conductive structures 49 can be increased as needed, such that the size of the wiring board 40 can be miniaturized.

In addition, the first circuit block 21 can be provided between two second circuit blocks 22, and the receiving S is interconnected via a plurality of first grooves V1, as shown in an electronic package 4 of FIGS. 4A and 4B. For instance, a plurality of second grooves V2 interconnecting the first circuit block 21 can be formed, and the first grooves V1 are perpendicular to the second grooves V2, forming a cross-shaped groove structure V. Therefore, the first circuit block 21 is positioned at the intersection of the cross-shaped groove structure V, and the second circuit blocks 22 are positioned at two opposite ends of one of the grooves (i.e., a first groove V1) of the cross-shaped groove structure V, and the plurality of conductive structures 49 can be arranged in the cross-shaped groove structure V (i.e., both the first grooves V1 and the second grooves V2). More specifically, the receiving space S and the cross-shaped groove structure V partitions the circuit board 40 into a plurality of (e.g., four) zones 41, 42, 43, 44. It can be appreciated that the arrangement of the grooves can be adjusted according to the needs, and is not limited to the cross-shaped groove structure V.

Therefore, with the design of these grooves, the contact area of the encapsulating layer 23 is increased to facilitate the distribution of thermal stress, thus increasing the structural strength of the composite substrate 4a. The sizes of the conductive pillars 211, 221 (and even the conductive structures 49) in the composite substrate 4a can be further reduced compared to other embodiments (e.g., the conductive pillars 211, 221 in the composite substrate 2a), thereby allowing more contacts (I/O) to be placed in the composite substrate 4a (increasing its density). In other words, when the functional requirements of the electronic components 25, 25' increase, with the design of the grooves, the structural strength of the circuit board 40 can be enhanced. This is not only beneficial to the miniaturization of the circuit board 40, but also prevents issues associated with warpage due to high temperature.

In addition, the composite substrate 2a, 4a of the present disclosure (which can be regarded as an interposer) is an insulating material formed by the RDL process instead of the conventional silicon interposer. Thus, the manufacturing cost can be greatly reduced, and the occurrence of warpage can be lowered.

The present disclosure further provides an electronic package 2, 4, which includes: an encapsulating layer 23, a circuit board 20, 40, a first circuit block 21, a second circuit block 22, a first circuit structure 24, at least one electronic component 25, 25' and a second circuit structure 27.

The encapsulating layer 23 includes a first surface 23a and a second surface 23b opposite to each other.

The circuit board 20, 40 is embedded in the encapsulating layer 23.

The first circuit block 21 and the second circuit block 22 are embedded in the encapsulating layer 23.

The first circuit structure 24 is formed on the first surface 23a of the encapsulating layer 23 and electrically connected with the circuit board 20, 40, the first circuit block 21 and the second circuit block 22.

The electronic component 25, 25' is provided on the first circuit structure 24 and electrically connected with the first circuit structure 24.

The second circuit structure 27 is formed on the second surface 23b of the encapsulating layer 23 and electrically connected with the circuit board 20, 40, the first circuit block 21 and the second circuit block 22.

In an embodiment, the first circuit block 21 and the second circuit block 22 embedded in the encapsulating layer 23 are spaced apart from each other.

In an embodiment, the circuit board 20, 40 is spaced apart from the first circuit block 21 and the second circuit block 22.

In an embodiment, the circuit board 20, 40 includes a receiving space S for receiving the first circuit block 21 and the second circuit block 22, and the encapsulating layer 23 is further formed in the receiving space S to encapsulate the first circuit block 21 and the second circuit block 22.

In an embodiment, the circuit board 40 is formed with a first groove V1 and a second groove V2. For example, the first groove V1 and the second groove V2 form a cross-shaped groove structure V. Furthermore, the encapsulating layer 23 is formed in the first groove V1 and the second groove V2.

In an embodiment, a plurality of conductive structures 49 are embedded in the encapsulating layer 23.

In an embodiment, the electronic package 2, 4 further includes a packaging layer 26 for encapsulating the electronic component 25, 25'.

In an embodiment, the electronic package 2, 4 further includes a plurality of conductive components 28 formed on the second circuit structure 27.

In an embodiment, the first circuit block 21 has at least one insulating body 210 (or semiconductor base) and at least one conductive pillar 211 embedded in the insulating body 210 (or semiconductor base). For example, a circuit portion 21a, 21b, 21c electrically connected with the conductive pillar 211 is formed on at least one of the two opposite sides of the insulating body 210 (or semiconductor base). Alternatively, the insulating body 210 has a packaging material, and the semiconductor base includes silicon.

In an embodiment, the second circuit block 22 has at least one insulating body 220 (or semiconductor base) and at least one conductive pillar 221 embedded in the insulating body 220 (or semiconductor base). For example, a circuit portion 21a, 21b, 21c electrically connected with the conductive pillar 221 is formed on at least one of the two opposite sides of the insulating body 220 (or semiconductor base). Alternatively, the insulating body 220 has a packaging material, and the semiconductor base includes silicon.

In an embodiment, the circuit board 20 is a coreless circuit structure.

In an embodiment, a plurality of electronic components 25, 25' are provided on the first circuit structure 24, and there is gap between at least two of the plurality of electronic components 25, 25', such that the first circuit block 21 is positioned in the gap for electrically bridging the two electronic components 25, 25'.

In conclusion, in the electronic package and the manufacturing method of the same in accordance with the present disclosure, the configuration of the composite substrate allows the circuit blocks and the circuit board to be embedded in the encapsulating layer at a distance, so overheating will not occur in the circuit board of the present disclosure. This avoids warpage of the circuit board, and in turn, prevents the circuit layer of the circuit board from breaking. Also, the spaced-apart circuit blocks and the circuit board embedded in the encapsulating layer increases the structural strength of the encapsulating layer.

The above embodiments are set forth to illustrate the principles of the present disclosure, and should not be interpreted as to limit the present disclosure in any way. The above embodiments can be modified by one of ordinary skill in the art without departing from the scope of the present disclosure as defined in the appended claims.

What is claimed is:

1. A method for manufacturing an electronic package, comprising:
   providing a circuit board and at least one circuit block at a distance from one another on a carrier board, wherein the circuit block is used for transmitting power, and the circuit board is formed with a plurality of grooves forming a cross-shaped groove structure;
   forming an encapsulating layer on the carrier board for encapsulating the circuit board and the circuit block, wherein the encapsulating layer has a first surface and a second surface opposite to each other, and the encapsulating layer is bonded onto the carrier board via the second surface;
   disposing at least one electronic component upon the circuit block, the at least one electronic component being electrically connected with the circuit block;
   removing the carrier board; and
   forming a second circuit structure on the second surface of the encapsulating layer, the second circuit structure being electrically connected with the circuit board and the circuit block.

2. The method of claim 1, wherein a plurality of circuit blocks are embedded in the encapsulating layer at a distance to one another.

3. The method of claim 1, wherein the circuit board and the circuit block are spaced apart from each other.

4. The method of claim 1, wherein the circuit board is provided with a receiving space for receiving the circuit block, and the encapsulating layer is further formed in the receiving space to encapsulate the circuit block.

5. The method of claim 1, wherein the encapsulating layer is formed in the grooves.

6. The method of claim 1, wherein a plurality of conductive structures are embedded in the encapsulating layer.

7. The method of claim 1, further comprising encapsulating the electronic component with a packaging layer.

8. The method of claim 1, further comprising forming a plurality of conductive components on the second circuit structure.

9. The method of claim 1, wherein the circuit block has at least an insulating body or at least one semiconductor base and at least one conductive pillar embedded in the insulating body or the semiconductor base.

10. The method of claim 9, wherein the insulating body is an encapsulant, and the semiconductor base includes silicon.

11. The method of claim 9, further comprising forming a circuit portion electrically connected with the conductive pillar on at least one of the two opposite sides of the insulating body or the semiconductor base.

12. The method of claim 1, wherein the circuit board is a coreless circuit structure.

13. The method of claim 1, further comprising forming a first circuit structure on the first surface of the encapsulating layer, the first circuit structure being electrically connected with the circuit board and the circuit block.

14. The method of claim 13, wherein a plurality of electronic components are provided on the first circuit structure, and a gap is formed between at least two of the plurality of electronic components, such that the circuit block is positioned in the gap for electrically bridging the two electronic components.

15. The method of claim 1, wherein the circuit block acts as a bridging component for the electronic component.

* * * * *